United States Patent [19]

Morishita

[11] Patent Number: 5,424,252

[45] Date of Patent: Jun. 13, 1995

[54] PHOTO-PLATING SOLUTION AND PROCESS

[75] Inventor: Shinya Morishita, Aichi, Japan

[73] Assignee: Kabushiki Kaisha Toyota Chuo Kenkyusho, Aichi, Japan

[21] Appl. No.: 152,925

[22] Filed: Nov. 16, 1993

Related U.S. Application Data

[63] Continuation of Ser. No. 953,966, Sep. 30, 1992, abandoned.

[30] Foreign Application Priority Data

Oct. 4, 1991 [JP] Japan .................................. 3-285664
Mar. 27, 1992 [JP] Japan .................................. 4-101926

[51] Int. Cl.⁶ ............................................. H01L 21/02
[52] U.S. Cl. .................................. 437/230; 427/443.1; 427/443.2; 427/553; 427/581
[58] Field of Search ................... 427/437, 443.1, 305, 427/553, 230, 443.2, 581

[56] References Cited

U.S. PATENT DOCUMENTS

| | | | |
|---|---|---|---|
| 4,151,311 | 4/1979 | Feldstein | 427/305 |
| 4,359,485 | 11/1982 | Donnelly | 437/230 |
| 4,419,390 | 12/1983 | Feldstein | 437/230 |
| 4,472,458 | 9/1984 | Sirinyan | 427/443.1 |
| 4,661,372 | 4/1987 | Mance | 427/553 |
| 4,738,869 | 4/1988 | Baumgartner | 437/230 |
| 4,910,049 | 3/1990 | Bindra | 427/305 |
| 5,314,725 | 5/1994 | Morishita | 427/553 |

FOREIGN PATENT DOCUMENTS 17479 1/1982 Japan .................................. 437/230
63-157314 6/1988 Japan .

OTHER PUBLICATIONS

M. Paunovic "Electrochemical Aspects of Electroless Deposition of Metals" Plating, Nov. 1968, pp. 1161–1167.

Kirk-Othmer "Encyclopedia of Chemical Technology" vol. 8, 3rd ed. John Wiley & Sons 1979, pp. 738–741.

Primary Examiner—Michael Lusignan
Attorney, Agent, or Firm—Oblon, Spivak, McClelland, Maier & Neustadt

[57] ABSTRACT

An electroless metal or alloy plating solution as a photo-plating solution contains at least one of copper, nickel, cobalt or tin, and a sacrificial reagent which supplies electrons as a result of irreversible oxidative decomposition. A semiconductor is supported on a substrate, and dipped in the photo-plating solution, and the surface of the semiconductor is irradiated with light having a higher level of energy than the exciting energy of the semiconductor. A thick coating containing at least one of copper, nickel, cobalt or tin can be formed on that portion of the semiconductor which has been irradiated with light.

5 Claims, 1 Drawing Sheet

PHOTO-PLATING SOLUTION AND PROCESS

This application is a Continuation of application Ser No. 07/953,966, filed on Sep. 30, 1992, now abandoned.

BACKGROUND OF THE INVENTION

1. Field of the Invention

This invention relates to a photo-plating solution and process which can form a thick metal or alloy coating containing at least one of copper, nickel, cobalt and tin on only the light-radiated portions of a semiconductor supported on a substrate, and which can be employed to form e.g., an electric-circuit pattern on a printed-circuit board.

2. Description of the Related Art

There is known a photo-plating process which utilizes radiant energy of light to deposit a metal selectively on the light-radiated portions of a substrate. More specifically, the photo-oxidation-reduction reaction of a semiconductor which has absorbed light is utilized to deposit a metal on only the light-radiated portions of a substrate on .which a semiconductor is supported, as disclosed in Japanese Laid-Open Patent Publication No. 205388/1990 and Japanese Patent Publication No. 2950/1990, and aqueous metal-ion solutions containing alcohol or form aldehyde as a reducing agent are used as plating solutions. Referring in more detail to the known process, a substrate on which a semiconductor, such as $TiO_2$, is supported is immersed in an aqueous metal-ion solution containing a reducing agent, and ultraviolet light is applied to the semiconductor to form electrons on the conduction band thereof, so that the electrons may reduce the metal ion in the solution to deposit metal on the semiconductor. The reducing agent supplies electrons to holes formed in the valence band of the semiconductor by ultraviolet light, and prevents the holes from reacting with the electrons formed in the conduction band. The known process, however, has the drawback that if a metal layer having a thickness of several thousand angstroms is deposited on the semiconductor, it disables light to reach the semiconductor and effect the deposition of metal, resulting in the failure to form a thick metal layer.

SUMMARY OF THE INVENTION

It is an object of this invention to provide a photo-plating solution which enables the formation of a thick metal or alloy coating containing at least one of copper, nickel, cobalt or tin on only those portions of a substrate on which a semiconductor is supported.

It is another object of this invention to provide a photo-plating process which enables the formation of a thick metal or alloy coating containing at least one of copper, nickel, cobalt or tin on only those portions of a substrate on which a semiconductor is supported.

The inventors of this invention have found that the known process employing an aqueous solution containing copper, nickel, cobalt or tin ion cannot form a deposited metal layer having a thickness larger than about 1000 Å, since a thicker layer disables light to reach the semiconductor. The inventors have, therefore, considered that if an electroless plating solution of e.g. copper is employed, and if only a small amount of metal is deposited on a semiconductor by the irradiation of light., the deposited metal can be used as a nucleus for the deposition of metal from the electroless plating solution to thereby form a thick metal coating.

According to a first aspect of this invention, therefore, there is provided a photo-plating solution which is used to deposit by utilizing light a metal or alloy layer containing at least one of copper, nickel, cobalt and tin on a semiconductor supported on a substrate, and which comprises an electroless plating solution of at least one metal selected from copper, nickel, cobalt, tin or an alloy thereof, and a sacrificial reagent which supplies electrons by irreversible oxidative decomposition.

The photo-plating solution of this invention can form a thick copper, nickel, cobalt or tin coating, as will hereunder be described. Light having a higher level of energy than the exciting energy of a semiconductor is applied to the semiconductor supported on a substrate to produce electrons in its conduction band, and holes in its valence band. Electrons are donated from the sacrificial reagent in the solution to the holes to cause them to disappear. The electrons produced in the conduction band are, therefore, not consumed by their reaction with the holes, but can all be used to reduce copper, nickel, cobalt or tin ions in the solution to enable e.g., copper to be deposited on the semiconductor. The metal deposited on the semiconductor forms a nucleus which enables the continuous deposition of the metal from the solution to form a thick metal coating on the semiconductor.

The electroless plating solution of this invention, which contains ions of at least one of copper, nickel, cobalt and tin enables the deposition of e.g., copper even after the termination of its deposition by the irradiation of light, and thereby the formation of a thick layer of copper or the like.

According to a second aspect of this invention, there is provided a photo-plating process which comprises the steps of: supporting a semiconductor on a substrate, immersing the semiconductor in an electroless plating solution which comprises at least one metal selected from copper, nickel, cobalt and tin, or an alloy thereof, and a sacrificial reagent which supplies electrons by irreversible oxidative decomposition; and irradiating the surface of the semiconductor with light having a higher level of energy than the exciting energy of the semiconductor.

The process of this invention can form a thick coating of e.g., copper for the same reasons as have hereinabove been set forth with respect to the first aspect of this invention. It can form a thick metal coating within a short time, since both the deposition of the metal by the application of light and the deposition of the metal from the solution occur during the initial stage of deposition.

If the semiconductor is supported in a particular pattern on the substrate, it is possible to form in that pattern with a thick metal or alloy coating containing at least one of copper, nickel, cobalt or tin. Alternatively, it is possible to form such a coating in a particular pattern if the substrate, on which the semiconductor is supported, is scanned fin that pattern with a beam of light from e.g. , a laser. The process can simplify the manufacture of a printed circuit, as compared with any conventional process employing a photoresist.

DETAILED DESCRIPTION OF THE INVENTION

Figure 1:
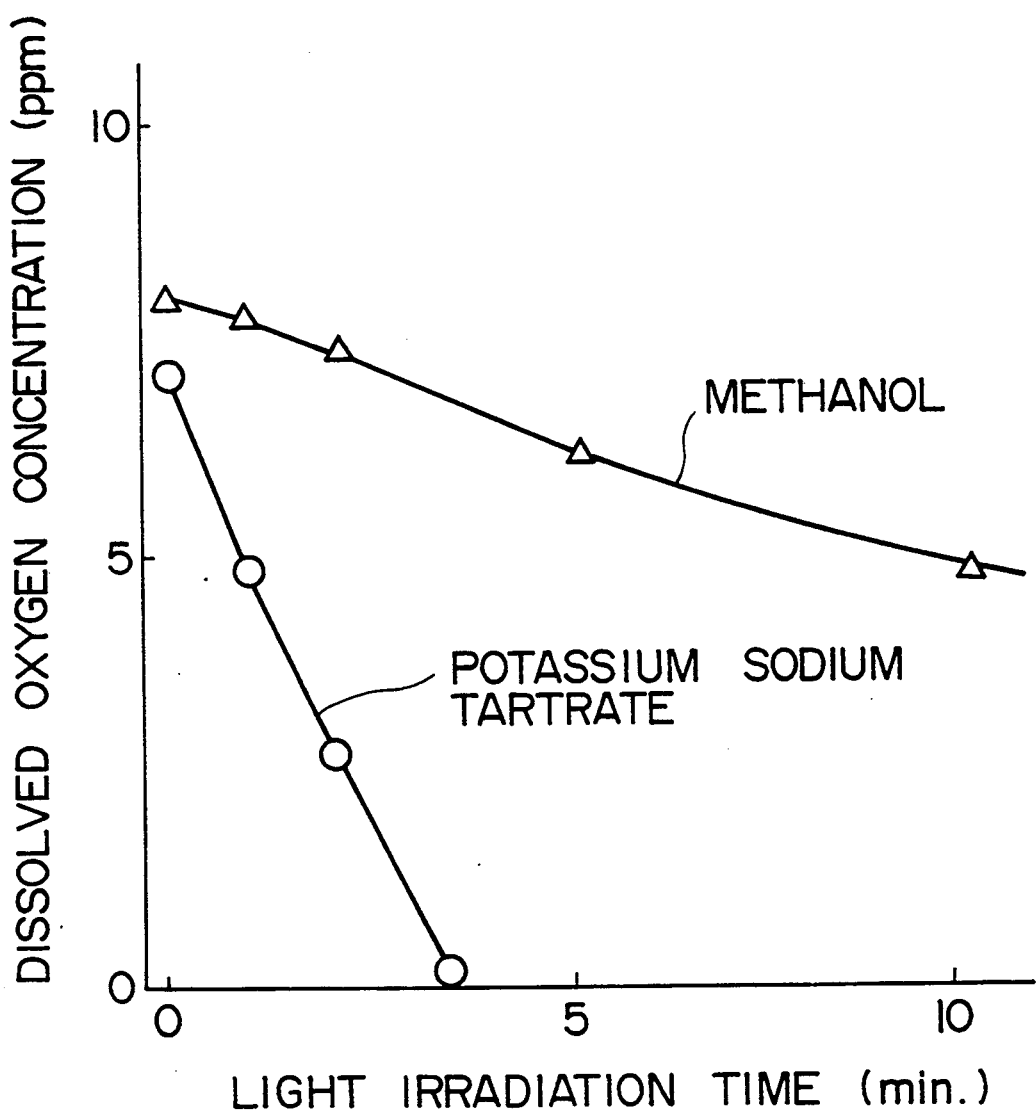
FIG. 1 is a graph showing the reduction of dissolved oxygen concentration in relation to light irradiation time.

The electroless plating solution which is employed to make the photo-plating solution of this invention may be any composition if it enables the growth of a metal deposit on a nucleus of copper, nickel, cobalt or tin formed on a semiconductor by the irradiation of light, and thereby the formation of a thick metal or alloy coating. The solution may contain one or more of copper, nickel, cobalt or tin. It may further contain tungsten, molybdenum, manganese, zinc, rhenium, etc.

The photo-plating solution of this invention further contains a sacrificial reagent. The sacrificial reagent may be any substance that can supply electrons by irreversible oxidative decomposition to holes produced in the valence band of a semiconductor by the action of light. The solution preferably contains the sacrificial reagent at a concentration which is higher by at least one figure than the concentration of dissolved oxygen in the solution which may be in the range of 2 to $3 \times 10^{-4}$ mol/l, as it also serves to remove by reduction dissolved oxygen which hinders the deposition of metal.

The sacrificial reagent may be selected from any substances that have usually been employed. It is, however, preferable to use at least one substance selected from among amines, imines, alkanolamines, hydroxycarboxylic acids and aminocarboxylic acids, since the use of any such substance enables the rapid formation of a thick metal coating.

The reduction of metal ions in the solution is performed by electrons produced in the conduction band of the semiconductor by the irradiation of light. These electrons are, however, first used to reduce the dissolved oxygen which the solution contains, and the reduction of metal ions does not take place until after nearly all of the dissolved oxygen is reduced. The use of the preferred sacrificial reagent selected from among e.g., amines, however, enables an accelerated reduction of dissolved oxygen and thereby an earlier reduction of metal ions by the electrons produced in the conduction band, and makes it possible to form a thick metal coating more rapidly.

Reference is made to FIG. 1 showing the effect of potassium sodium tartrate in reducing dissolved oxygen in comparison with an alcohol. It shows the results obtained by experiments. The experiments were made by preparing an aqueous solution containing, per liter, 0.02 mol of potassium sodium tartrate as a preferred sacrificial reagent selected from among hydroxycarboxylic acids, 1 g of a $TiO_2$ powder as a semiconductor, 0.01 mol of copper sulfate as a source of copper ions, and a comparative aqueous solution containing 10% by volume of methanol, which is not a preferred sacrificial reagent, instead of potassium sodium tartrate. Both of the solutions had a pH of about 3. An electrode was placed in each solution to detect its dissolved oxygen concentration. Each solution was wholly irradiated with ultraviolet light and detection was made of its dissolved oxygen concentration varying with the passage of irradiation time. The dissolved oxygen in the solution containing potassium sodium tartrate could be completely removed within a shorter time than in the solution containing methanol, thereby enabling the deposition of copper to start earlier. It was about two minutes after the complete removal of dissolved oxygen from each solution that copper was deposited on the $TiO_2$ powder, giving its color to the powder.

It is possible to use as the sacrificial reagent a substance which serves as a complexing agent to stabilize metal ions in the electroless plating solution, as well as supplying electrons to the holes produced in the valence band of the semiconductor by the irradiation of light. Examples of this kind of substance are triethanolamine, triisopropanolamine, ethylenediaminetetraacetic acid, citric acid, malic acid, potassium sodium tartrate, monoethanolamine, diethanolamine, polyethyleneimine, ethylenediamine, diethylenediamine, diethylenetriamine, diethylenetriaminepentaacetic acid, triethylenetetramine, triaminotriethylamine, tetraethylenepentamine, pentaethylenehexamine, nitrilotriacetic acid, gluconic acid, pentahydroxypropyldiethylenetriamine, N-hydroxyethylethylenediaminetriacetic acid, and quadrol.

If the sacrificial reagent is a substance serving also as a complexing agent, the plating solution preferably contains it at a concentration, which is higher by at least one figure than the dissolved oxygen concentration of the solution, as hereinabove stated, and also 2 to 25 times higher than the concentration of metal ions in the solution. If the concentration of the sacrificial reagent is less than twice as large as the metal-ion concentration, the solution is unstable, and if it is more than 25 times, the solution is too stable to permit a satisfactorily high plating speed.

Even if the sacrificial reagent serving also as a complexing agent, may somewhat be consumed for reducing dissolved oxygen, the solution hardly undergoes any change in composition, since it contains the complexing agent at a concentration of 0.2 to 0.3 mol/l which is about 1,000 times higher than the dissolved oxygen concentration of 2 to $3 \times 10^{-4}$ mol/l.

Although an electroless plating solution is usually composed of a metal salt, a reducing agent and a complexing agent, it is beneficial to employ a sacrificial reagent serving also as a complexing agent, since the solution does not need to contain any particular complexing agent, but is simpler in composition and easier to handle.

Although there is no particular limitation to the substrate material, on which the semiconductor to be plated is supported, it is necessary for substrate material to be an electrically non-conductive, such as alumina or another inorganic material, or a glass-epoxy laminate or another organic material, if a circuit pattern or the like is to be formed on its surface.

The semiconductor may be of any substance if its conduction band has an energy level which is more negative than the reduction potential of copper, nickel, cobalt or tin ions, so that the electrons produced in the conduction band by the action of light can reduce metal ions. Examples of the appropriate substances are $TiO_2$, $ZnO$, $Fe_2O_3$, $SrTiO_3$, $BaTiO_3$, $KTaO_3$, $CdSe$, $CdS$, $SiC$ and $GaP$.

The process of this invention is started by supporting a semiconductor on a substrate. The substrate is degreased with e.g. an organic solvent before it is used. The substrate preferably has an etched and finely uneven surface which facilitates the adherence of the semiconductor. For etching it, it is possible to use, for example, a molten alkali, hot phosphoric acid, or hydrofluoric acid if the substrate is of an inorganic material, and a mixture of sulfuric and chromic acids, of potassium permanganate and phosphoric acid, or of phosphoric and perchloric acids if it is of an organic material.

A variety of methods can be employed to support the semiconductor on the substrate. They include PVD such as vacuum deposition, sputtering or ionic plating, CVD, and the bonding of the semiconductor dispersed in a binder to the substrate. The following methods can be also employed:

(1) This is a method which is applicable to semiconductors such as $TiO_2$, $ZnO$, $Fe_2O_3$, $SrTiO_3$, $BaTiO_3$ and $KTaO_3$. An alcoholic solution is prepared from one or more of alkoxides of Ti, Zn, Fe, Sr, Ba, K and Ta, depending on the composition of the semiconductor to be formed. A substrate is dipped in the alcoholic solution, or the solution is sprayed against the substrate, and the solution adhering to the substrate is fired to form the desired semiconductor, e.g. $TiO_2$, on the substrate.

(2) This is a method which is applicable to semiconductors such as $TiO_2$, $ZnO$ and $Fe_2O_3$. This method employs a HCl solution of $TiCl_3$; or a solution of $ZnX_2$ (X is a halogen), $Zn(NO_3)_2$ or a zinc salt and an organic acid such as formic or acetic acid; or a solution of $FeX_3$ (X is a halogen), $Fe(NO_3)_3$ or an iron salt and an organic acid such as formic or acetic acid. A substrate is dipped in the solution or the solution is sprayed against the substrate, and the solution adhering to the substrate is fired to deposit $TiO_2$, $ZnO$ or $Fe_2O_3$ on the substrate.

(3) This is a method which is applicable to semiconductors such as $TiO_2$ and $ZnO$. A substrate is dipped in sol of $TiO_2$ or $ZnO$, or the sol is sprayed against the substrate, and the sol adhering to the substrate is fired to deposit $TiO_2$ or $ZnO$ thereon. The sol has so small a particle diameter that even the dipping of the substrate in the sol, or the spraying of the sol against the substrate, followed by rinsing with water, and drying, but not by firing, may enable the deposition of an appropriate amount of $TiO_2$ or $ZnO$ on the substrate. This method is, therefore, useful when the substrate cannot be heated to a high temperature. It is, however, preferable to heat the substrate at a temperature not exceeding the maximum temperature that it can withstand, so that the deposit of $TiO_2$ or $ZnO$ may adhere more strongly to it.

(4) This is a method which is applicable to $TiO_2$. A substrate is dipped in a solution of a titanium-containing coupling agent in an organic solvent such as hexane, or the solution is sprayed against it, and the solution adhering to the substrate is fired to deposit $TiO_2$ thereon.

(5) This is a method which is applicable to semiconductors such as CdSe and CdS. A substrate is dipped in a solution containing a selenourea or thiourea complex of cadmium, or the solution is sprayed against it, and the solution adhering to the substrate is fired to deposit CdSe or CdS thereon as a result of the decomposition of the complex.

(6) This is a method which is applicable to $TiO_2$. A substrate is dipped in a solution containing a fine colloid of $TiO_2$, and degreasing and surface-treating agents used in the zinc-phosphate treatment of iron and steel, or the solution is sprayed against it, followed by water rinsing, and drying, whereby a deposit of $TiO_2$ is formed on the substrate.

The plating solution which is employed by the process of this invention is prepared by adding a sacrificial reagent to an ordinary electroless plating solution containing at least one of copper, nickel, cobalt, tin or an alloy thereof.

The substrate on which the semiconductor is supported is immersed in the plating solution, and light is irradiated to the surface of the semiconductor. The light may be of any source that can emit light having a wavelength in the visible to ultraviolet range, and a higher level of energy that the exciting energy of the semiconductor. Specific examples of the appropriate light source are an ultrahigh-, high-, or low-pressure mercury lamp, a xenon arc lamp, a tungsten lamp, and a laser. The length of time for which the irradiation of light is continued depends on the amount of light absorbed by the semiconductor, the temperature of the solution, and the sacrificial reagent employed.

EXAMPLES

The invention will now be described more specifically with reference to several examples thereof.

Example 1

Twelve substrates of alumina having a purity of 96% (Nos. 1 to 12) were degreased by three minutes of ultrasonic cleansing in acetone as a guaranteed reagent, and thereafter by 60 minutes of ultrasonic cleansing in a solution of NaOH having a concentration of 1 mol/l. The substrate surfaces were etched by 60 minutes of immersion in a solution of HF having a concentration of 1 mol/l, rinsed with water, and dried. Substrates Nos. 1 to 6 were dipped for two seconds in a sol of $TiO_2$ (a mixture of rutile and anatase produced by Nissan Chemical Industrial Co., Ltd., and having a particle diameter of 100 to 200 Å) having a concentration of 1 g/l, were rinsed in a stream of water for 10 seconds, and were dried. Then, they were fired at 500° C. for an hour to yield alumina substrates carrying $TiO_2$ as a semiconductor. Substrates Nos. 7 to 12 were coated by five seconds of spraying with an aqueous solution of $Zn(CH_3COO)_2$ having a concentration of 0.05 mol/l, and were fired at 400° C. for an hour to yield alumina substrates carrying ZnO as a semiconductor.

Table 1 shows three kinds of electroless copper plating solutions employed, each containing ethylenediaminetetraacetic acid (EDTA), triethanolamine (TEA) or potassium sodium tartrate (Tart) as a sacrificial reagent serving also as a complexing agent. Each substrate was dipped in one of the plating solutions, which kept at room temperature, was irradiated with light, and was examined for the resulting deposition of copper by a scanning electron microscope. A 250 W ultrahigh-pressure mercury lamp was used as a light source. The light thereby emitted was passed through a filter for cutting off infrared rays to eliminate the thermal effect thereof, and the light passing through the filter was irradiated to the substrate through a mask.

TABLE 1

| | Composition of electroless copper plating solution | | |
|---|---|---|---|
| | EDTA type | TEA type | Tart type |
| Concentration of sacrificial reagent (mol/l) | | | |
| EDTA | 0.3 | — | — |
| TEA | — | 0.2 | — |
| Tart | — | — | 0.3 |
| Concentration of copper salt (mol/l) | | | |
| $CuSO_4$ | 0.04 | — | 0.03 |
| $CuCl_2$ | — | 0.08 | — |

TABLE 1-continued ited like islands formed nuclei for a continuous thick copper coating.

TABLE 2

| No. | Semi-conductor | Electroless copper plating solution type | Plating conditions | Structure of copper deposit — Portion irradiated with light | Portion not irradiated |
|---|---|---|---|---|---|
| 1 | $TiO_2$ | EDTA | 5 min. of light irradiation | Island like semipherical particles with $\phi$ of several hundreds Å | No deposit |
| 2 | $TiO_2$ | EDTA | After 5 min. of light irradiation left for 60 hours. | Film having a thickness of about 60 $\mu$m | No deposit |
| 3 | $TiO_2$ | TEA | 5 min. of light irradiation | Island like semipherical particles with $\phi$ of several hundreds Å | No deposit |
| 4 | $TiO_2$ | TEA | After 5 min. of light irradiation, left for 60 hours. | Film having a thickness of about 40 $\mu$m | No deposit |
| 5 | $TiO_2$ | Tart | 5 min. of light irradiation | Island like semipherical particles with $\phi$ of several hundreds Å | No deposit |
| 6 | $TiO_2$ | Tart | After 5 min. of light irradiation, left for 60 hours. | Film having a thickness of about 20 $\mu$m | No deposit |
| 7 | ZnO | EDTA | 5 min. of light irradiation | Island like semipherical particles with $\phi$ of several hundreds Å | No deposit |
| 8 | ZnO | EDTA | After 5 min. of light irradiation, left for 60 hours. | Film having a thickness of about 30 $\mu$m | No deposit |
| 9 | ZnO | TEA | 5 min. of light irradiation | Island like semispherical particles with $\phi$ of several hundreds Å | No deposit |
| 10 | ZnO | TEA | After 5 min. of light irradiation, left for 60 hours. | Film having a thickness of about 30 $\mu$m | No deposit |
| 11 | ZnO | Tart | 5 min. of light irradiation | Island like semipherical particles with $\phi$ of several hundreds Å | No deposit |
| 12 | ZnO | Tart | After 5 min. of light irradiation, left for 60 hours. | Film having a thickness of about 20 $\mu$m | No deposit |

| | Composition of electroless copper plating solution | | |
|---|---|---|---|
| | EDTA type | TEA type | Tart type |
| HCHO concentration (mol/l) | 0.1 | 0.08 | 0.3 |
| pH | 12.5 | 12.8 | 12.8 |

Table 2 shows the semiconductor supported on each substrate, the solution and conditions employed for plating it, and the structure of a copper deposit formed thereon. Substrates Nos. 1, 3, 5, 7, 9 and 11 were lifted from the solutions immediately after five minutes of irradiation, and semispherical copper particles having a diameter of several hundred angstroms and districted like islands were found on the irradiated portion of each substrate. On the other hand, substrates Nos. 2, 4, 6, 8, 10 and 12 were left to stand in the solutions for 60 hours after five minutes of irradiation, and a layer of copper having a thickness of 20 to 60 microns was found on the irradiated portion of each substrate. The analysis by X-ray diffraction of the copper layer on each of Samples Nos. 2, 4, 6, 8, 10 and 12 did not reveal any diffraction line indicating the presence of any substance other than copper, such as $Cu_2O$, but confirmed that it was a layer of pure copper. No copper deposit was found on any portion not irradiated with light, but it was confirmed that the process embodying this invention could form a thick deposit of copper on only the irradiated portion. It was also found that copper particles deposited like islands formed nuclei for a continuous thick copper coating.

An electrode was place in each solution for detecting a change in its dissolved oxygen concentration after irradiation of light. Its dissolved oxygen concentration become zero about four minutes after the irradiation of light had been started. The surface of each substrate presented the color of copper about three minutes after the solution had ceased to contain any dissolved oxygen. These results confirm that the sacrificial reagent employed can reduce dissolved oxygen rapidly, thereby enabling the deposition of copper to start earlier.

Example 2

Twelve glass-epoxy substrates (Nos. 13 to 24) were degreased, and chemically etched in a mixture of sulfuric and chromic acids. Substrates Nos. 13 to 18 were dipped for two seconds in a sol of $TiO_2$ (a mixture of rutile and anatase produced by Nissan Chemical Industrial Co., Ltd., and having a diameter of 100 to 200 Å) having a concentration of 1 g/l, rinsed in a stream of water for 10 seconds, and dried to yield glass-epoxy substrates carrying $TiO_2$ as a semiconductor. On the other hand, a film of ZnO having a thickness of about 2,000 Å was formed by sputtering on each of substrates Nos. 19 to 24.

Then, each example was dipped in one of the plating solution shown in Table 1, was irradiated with light, and was examined for the deposition of copper by scanning electron microscope, as the samples in Example 1 had been. Table 3 shows the semiconductor supported on each sample, the solution and conditions employed for plating it, and the structure of a copper deposit formed thereon.

TABLE 3

| No. | Semi-conductor | Electroless copper plating solution type | Plating conditions | Structure of copper deposit — Portion irradiated with light | Portion not irradiated |
|---|---|---|---|---|---|
| 13 | $TiO_2$ | EDTA | 5 min, of light irradiation | Island like semipherical particles with $\phi$ of several hundreds Å | No deposit |
| 14 | $TiO_2$ | EDTA | After 5 min. of light irradiation, left for 60 hours. | Film having a thickness of about 40 $\mu$m | No deposit |

TABLE 3-continued

| No. | Semi-conductor | Electroless copper plating solution type | Plating conditions | Structure of copper deposit Portion irradiated with light | Portion not irradiated |
|---|---|---|---|---|---|
| 15 | $TiO_2$ | TEA | 5 min. of light irradiation | Island like semipherical particles with $\phi$ of several hundreds Å | No deposit |
| 16 | $TiO_2$ | TEA | After 5 min. of light irradiation, left for 60 hours. | Film having a thickness of about 30 $\mu$m | No deposit |
| 17 | $TiO_2$ | Tart | 5 min. of light irradiation | Island like semipherical particles with $\phi$ of several hundreds Å | No deposit |
| 18 | $TiO_2$ | Tart | After 5 min. of light irradiation, left for 60 hours. | Film having a thickness of about 15 $\mu$m | No deposit |
| 19 | ZnO | EDTA | 5 min. of light irradiation | Joined semipherical particles with $\phi$ of several hundreds Å | No deposit |
| 20 | ZnO | EDTA | After 5 min. of light irradiation, left for 60 hours. | Film having a thickness of about 30 $\mu$m | No deposit |
| 21 | Zno | TEA | 5 min. of light irradiation | Joined semipherical particles with $\phi$ of several hundreds Å | No deposit |
| 22 | ZnO | TEA | After 5 min. of light irradiation, left for 60 hours. | Film having a thickness of about 30 $\mu$m | No deposit |
| 23 | ZnO | Tart | 5 min. of light irradiation | Joined semipherical particles with $\phi$ of several hundreds Å | No deposit |
| 24 | ZnO | Tart | After 5 min. of light irradiation, left for 60 hours. | Film having a thickness of about 15 $\mu$m | No deposit |

Substrates Nos. 13, 15 and 17 were lifted from the solutions immediately after five minutes of irradiation, and semispherical copper particles having a diameter of several hundred angstroms and distributed like islands were found on the irradiated portion of each substrate. Semispherical copper particles having a smaller diameter and joined to one another were found on each of substrates Nos. 19, 21 and 23 which had also been lifted from the solutions immediately after five minutes of irradiation. Substrates Nos. 14, 16, 18, 20, 22 and 24 were left to stand in the solutions for 60 hours after irradiation, and a layer of copper having a thickness of 15 to 40 microns was found on the irradiated portion of each sample. The analysis by X-ray diffraction of the copper layer on each sample confirmed that it was a layer of pure copper.

No copper deposit was found on any portion that had not been irradiated with light, but it was confirmed that the process embodying this invention could form a thick deposit of copper on only the irradiated portion. It was also found that copper particles deposited like islands formed nuclei for a continuous thick copper coating.

Example 3

Example 1 was repeated for degreasing, etching, rinsing and drying twelve alumina substrates (Nos. 25 to 36). Substrates Nos. 25 to 30 were then dipped in 100 ml of ethanol solution containing 0.1 mol of titanium tetraisopropoxide ($Ti(O-i-C_3H_7)_4$), and fired at 500° C. for an hour to yield alumina substrates carrying $TiO_2$. Substrates Nos, 31 to 36 were dipped in an aqueous solution containing a thiourea complex of cadmium at a concentration of 0.05 mol/l, and fired at 400° C. for an hour to yield alumina substrates carrying CdS.

Then, each sample was dipped in one of the plating solutions shown in Table 1, and was irradiated with light, and examined for the deposition of copper by a scanning electron microscope, as the samples in Example 1 had been. Table 4 shows the semiconductor supported to each sample, the solution and conditions employed for plating it, and the structure of a copper deposit formed thereon.

TABLE 4

| No. | Semi-conductor | Electroless copper plating solution type | Plating conditions | Structure of copper deposit Portion irradiated with light | Portion not irradiated |
|---|---|---|---|---|---|
| 25 | $TiO_2$ | EDTA | 5 min. of light irradiation | Joined semipherical particles with $\phi$ of several hundreds Å | No deposit |
| 26 | $TiO_2$ | EDTA | After 5 min. of light irradiation, left for 60 hours | Film having a thickness of about 80 $\mu$m | No deposit |
| 27 | $TiO_2$ | TEA | 5 min. of light irradiation | Joined semipherical particles with $\phi$ of several hundreds Å | No deposit |
| 28 | $TiO_2$ | TEA | After 5 min. of light irradiation, left for 60 hours | Film having a thickness of about 50 $\mu$m | No deposit |
| 29 | $TiO_2$ | Tart | 5 min. of light irradiation | Joined semipherical particles with $\phi$ of several hundreds Å | No deposit |
| 30 | $TiO_2$ | Tart | After 5 min. of light irradiation, left for 60 hours | Film having a thickness of about 30 $\mu$m | No deposit |
| 31 | CdS | EDTA | 5 min. of light irradiation | Island like semipherical particles with $\phi$ of several hundreds Å | No deposit |
| 32 | CdS | EDTA | After 5 min. of light irradiation, left for 60 hours | Film having a thickness of about 20 $\mu$m | No deposit |
| 33 | CdS | TEA | 5 min. of light irradiation | Island like semipherical particles with $\phi$ of several hundreds Å | No deposit |
| 34 | CdS | TEA | After 5 min. of light irradiation, left for 60 hours | Film having a thickness of about 20 $\mu$m | No deposit |
| 35 | CdS | Tart | 5 min. of light irradiation | Joined semipherical particles with $\phi$ of several hundreds Å | No deposit |
| 36 | CdS | Tart | After 5 min. of light irradiation, | Island like semipherical particles with $\phi$ | No deposit |

TABLE 4-continued

| No. | Semi-conductor | Electroless copper plating solution type | Plating conditions | Structure of copper deposit Portion irradiated with light | Portion not irradiated |
|---|---|---|---|---|---|
| | | | left for 60 hours | of several hundreds Å | |

Semispherical copper particles having a diameter of several hundred angstroms and joined to one another were found on the irradiated portion of each of samples Nos. 25, 27 and 29, which had been lifted from the solutions immediately after five minutes of irradiation. Smaller semispherical copper particles distributed like islands were found on each of samples Nos. 31, 33 and 35. On the other hand, a layer of copper having a thickness of 10 to 80 microns was found on the irradiated portion of each of samples Nos. 26, 28, 30, 32, 34 and 36, which had been left to stand in the solutions for 60 hours after irradiation. The analysis by X-ray diffraction of the copper layer on each sample confirmed that it was a layer of pure copper.

No copper deposit was found on any portion that had not been irradiated with light, but it was confirmed that the process embodying this invention could form a thick copper deposit on only the irradiated portion. It was also found that copper particles deposited like islands formed nuclei for continuous thick copper coating.

Example 4

Example 1 was repeated for degreasing, etching, rinsing and drying 10 alumina substrates (Nos. 37 to 46). The method employed for sample No. 1 in Example 1 was repeated for forming $TiO_2$ on substrates Nos. 37 and 38. The method employed for sample No. 31 in Example 3 was repeated for forming CdS on substrates Nos. 39 to 42. Sputtering, which had been employed for sample No. 19 in Example 3, was employed for forming ZnO and SiC on substrates Nos. 43 and 44, and Nos. 45 and 46, respectively.

Table 5 shows two kinds of electroless plating solutions employed, each containing citric acid (Cit) or potassium sodium tartrate (Tart) as a sacrificial reagent serving also as a complexing agent. Each substrates was dipped in one of the solutions, and was irradiated with light, and examined for the deposition of nickel or cobalt by a scanning electron microscope, as the samples in Example 1 had been. The nickel plating solution had pH of 10 and the cobalt plating solution had a pH of 10 or 12. Sodium hydroxide was used for adjusting the pH of each solution. Table 6 shows the semiconductor supported on each sample, the solution and conditions employed for plating it, and the structure of a nickel or cobalt deposit formed thereon.

TABLE 5

| | Composition of electroless plating solution | |
|---|---|---|
| | Nickel | Cobalt |
| Concentration of sacrificial reagent (mol/l) | | |
| Cit | 0.2 | — |
| Tart | — | 0.5 |
| Concentration of nickel or cobalt salt (mol/l) | | |
| $NiCl_2$ | 0.1 | — |
| $CoSO_4$ | — | 0.08 |
| Sodium phosphinate (mol/l) | 0.1 | 0.1 |
| Boric acid (mol/l) | — | 0.5 |

TABLE 6

| No. | Semi-conductor | Electroless copper plating solution type | Plating conditions | Structure of copper deposit Portion irradiated with light | Portion not irradiated |
|---|---|---|---|---|---|
| 37 | $TiO_2$ | Cit nickel | 15 min. of light irradiation | Island like semipherical particles with φ of several hundreds Å | No deposit |
| 38 | $TiO_2$ | Cit nickel | After 15 min. of light irradiation, left for 60 hours. | Film having a thickness of about 10 μm | No deposit |
| 39 | CdS | Cit nickel | 15 min. of light irradiation | Island like semipherical particles with φ of several hundreds Å | No deposit |
| 40 | CdS | Cit nickel | After 15 min. of light irradiation, left for 60 hours. | Film having a thickness of about 10 μm | No deposit |
| 41 | CdS | Tart cobalt | 20 min. of light irradiation | Island like semipherical particles with φ of several hundreds Å | No deposit |
| 42 | CdS | Tart cobalt | After 20 min. of light irradiation, left for 60 hours. | Film having a thickness of about 10 μm | No deposit |
| 43 | ZnO | Cit nickel | 15 min. of light irradiation | Island like semipherical particles with φ of several hundreds Å | No deposit |
| 44 | ZnO | Cit nickel | After 15 min. of light irradiation, left for 60 hours. | Film having a thickness of about 10 μm | No deposit |
| 45 | SiC | Tart cobalt | 20 min. of light irradiation | Island like semipherical particles with φ of several hundreds Å | No deposit |
| 46 | SiC | Tart cobalt | After 20 min. of light irradiation, left for 60 hours. | Film having a thickness of about 10 μm | No deposit |

Substrates Nos. 37, 39 and 43 carrying $TiO_2$, CdS and ZnO, respectively, were lifted from the nickel plating solution having a pH of 10 immediately after 15 minutes of irradiation, while substrates Nos. 41 and 45 carrying CdS and SiC, respectively, were lifted from the cobalt plating solutions having a pH of 10 and 12, respectively, immediately after 20 minutes of irradiation. Semispherical nickel or cobalt particles having a diameter of several hundred angstroms and joined to one another were found on the irradiated portion of each sample. Substrates Nos. 38, 40, 42, 44 and 46 were left to stand in the plating solutions for 60 hours after irradiation, and a layer of nickel or cobalt having a thickness of about 10 microns was found on the irradiated portion of each sample. The analysis by X-ray diffraction of the layer confirmed that it was of nickel of cobalt.

No nickel or cobalt deposit was found on any portion that had not been irradiated with light, but it was confirmed that the process embodying this invention could form a thick deposit of nickel or cobalt on only the irradiated portion. It was also found that nickel or cobalt particles deposited like islands formed nuclei for a continuous thick nickel or cobalt coating.

What is claimed is:

1. A process for photo-plating a semiconductor which comprises the steps of supporting a semiconductor on a substrate, immersing said semiconductor in an electroless metal or alloy plating solution which comprises at least one metal or at least one alloy thereof, said at least one metal being selected from the group consisting of copper, nickel, cobalt and tin, and a sacrificial reagent for supplying electrons by irreversible oxidative decomposition, wherein said sacrificial reagent comprises a substance serving also as a complexing agent to stabilize ions of said at least one metal in said electroless plating solution and which comprises at least one compound selected from the group consisting of amines, imines, alkanolamines, hydroxycarboxylic acids and aminocarboxylic acids, and irradiating the surface of said semiconductor with light having a higher level of energy than the exciting energy of said semiconductor;

wherein said process forms a film of 10μ to several tens of μm.

2. A process as set forth in claim 1, wherein said sacrificial reagent comprises at least one compound selected from the group consisting of triethanolamine, ethylenediaminetetraacetic acid, citric acid and potassium sodium tartrate.

3. A process as set forth in claim 1, wherein said sacrificial reagent has a concentration which is higher by at least one figure than that of oxygen dissolved in said electroless plating solution, and 2 to 25 times higher than that of ions of said at least one metal in said electroless plating solution.

4. A process as set forth in claim 1, wherein said substrate is of alumina, or a glass-epoxy laminate.

5. A process as set forth in claim 1, wherein said semiconductor is of the type in which its conduction band has an energy level which is more negative than the reduction potential of ions of said at least one metal.

* * * * *